(12) United States Patent
Vahdat et al.

(10) Patent No.: US 11,640,837 B2
(45) Date of Patent: May 2, 2023

(54) MEMORY ARRAYS AND METHODS USED IN FORMING A MEMORY ARRAY

(71) Applicant: Micron Technology, Inc., Boise, ID (US)

(72) Inventors: Armin Saeedi Vahdat, Boise, ID (US); Richard J. Hill, Boise, ID (US); Aaron Michael Lowe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 15 days.

(21) Appl. No.: 17/397,028

(22) Filed: Aug. 9, 2021

(65) Prior Publication Data

US 2021/0366525 A1 Nov. 25, 2021

Related U.S. Application Data

(63) Continuation of application No. 16/793,263, filed on Feb. 18, 2020, now Pat. No. 11,120,852.

(51) Int. Cl.
*G11C 7/18* (2006.01)
*H01L 27/11582* (2017.01)
(Continued)

(52) U.S. Cl.
CPC .......... *G11C 7/18* (2013.01); *H01L 27/1157* (2013.01); *H01L 27/11524* (2013.01); *H01L 27/11556* (2013.01); *H01L 27/11582* (2013.01)

(58) Field of Classification Search
None
See application file for complete search history.

(56) References Cited

U.S. PATENT DOCUMENTS 10,607,996 B1 * 3/2020 Sasaki .............. H01L 27/10885
10,903,237 B1   1/2021 Hosoda et al.
(Continued)

OTHER PUBLICATIONS

Mackus et al., "From the Bottom-Up: Toward Area-Selective Atomic Layer Deposition with High Selectivity", Chemistry of Materials vol. 31, 2019, United States, pp. 2-12.
(Continued)

*Primary Examiner* — Hsien Ming Lee
(74) *Attorney, Agent, or Firm* — Wells St. John P.S.

(57) ABSTRACT

A method used in forming a memory array comprises forming digitlines above and electrically couple to memory cells there-below. The digitlines are laterally-spaced relative one another in a vertical cross-section. An upwardly-open void-space is laterally-between immediately-adjacent of the digitlines in the vertical cross-section. Conductive material of the digitlines is covered with masking material that is in and less-than-fills the upwardly-open void-spaces. The masking material is removed from being directly above tops of the digitlines to expose the conductive digitline material and to leave the masking material over sidewalls of the conductive digitline material in the upwardly-open void-spaces. Insulative material is selectively grown from the exposed conductive digitline material relative to the masking material across the upwardly-open void-spaces to form covered void-spaces there-from between the immediately-adjacent digitlines in the vertical cross-section. Structures independent of method are disclosed.

42 Claims, 16 Drawing Sheets

(51) Int. Cl.
  *H01L 27/11556*   (2017.01)
  *H01L 27/11524*   (2017.01)
  *H01L 27/1157*   (2017.01)

(56) References Cited

U.S. PATENT DOCUMENTS

| | | |
|---|---|---|
| 2013/0187112 A1 | 7/2013 | Kuniya |
| 2020/0027892 A1 | 1/2020 | Zhu et al. |
| 2020/0185407 A1 | 6/2020 | Xiao et al. |
| 2021/0104539 A1 | 4/2021 | Lee |
| 2021/0217694 A1 | 7/2021 | Jain et al. |

OTHER PUBLICATIONS

U.S. Appl. No. 17/395,211, filed Aug. 5, 2021, by Gupta et al.

\* cited by examiner

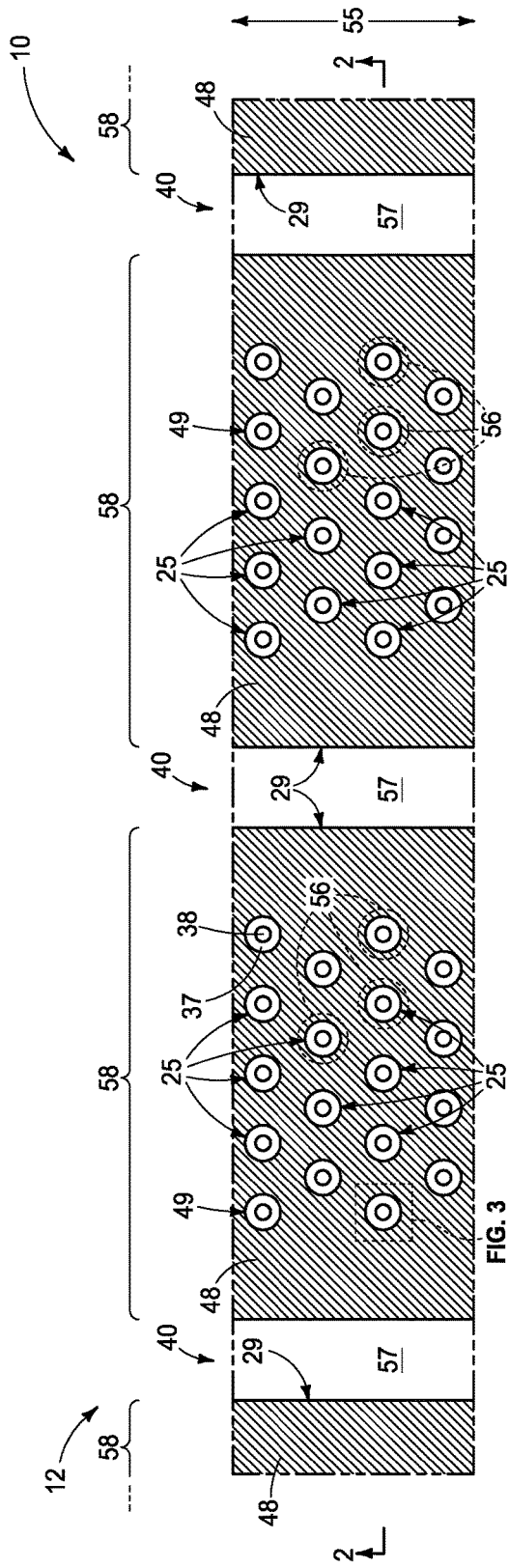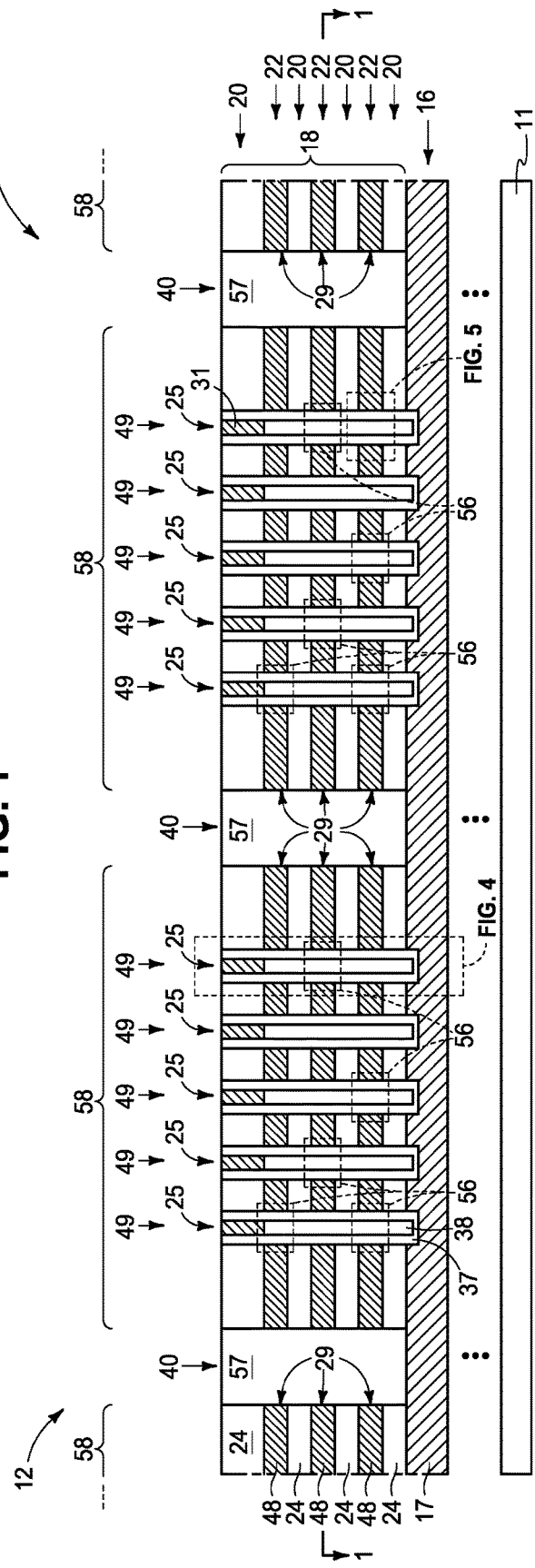

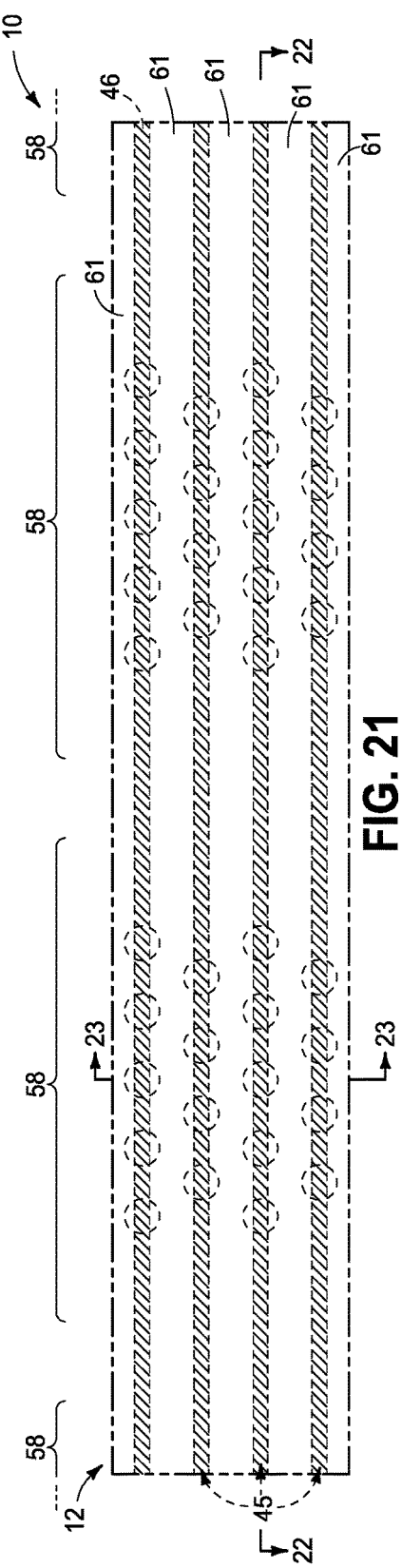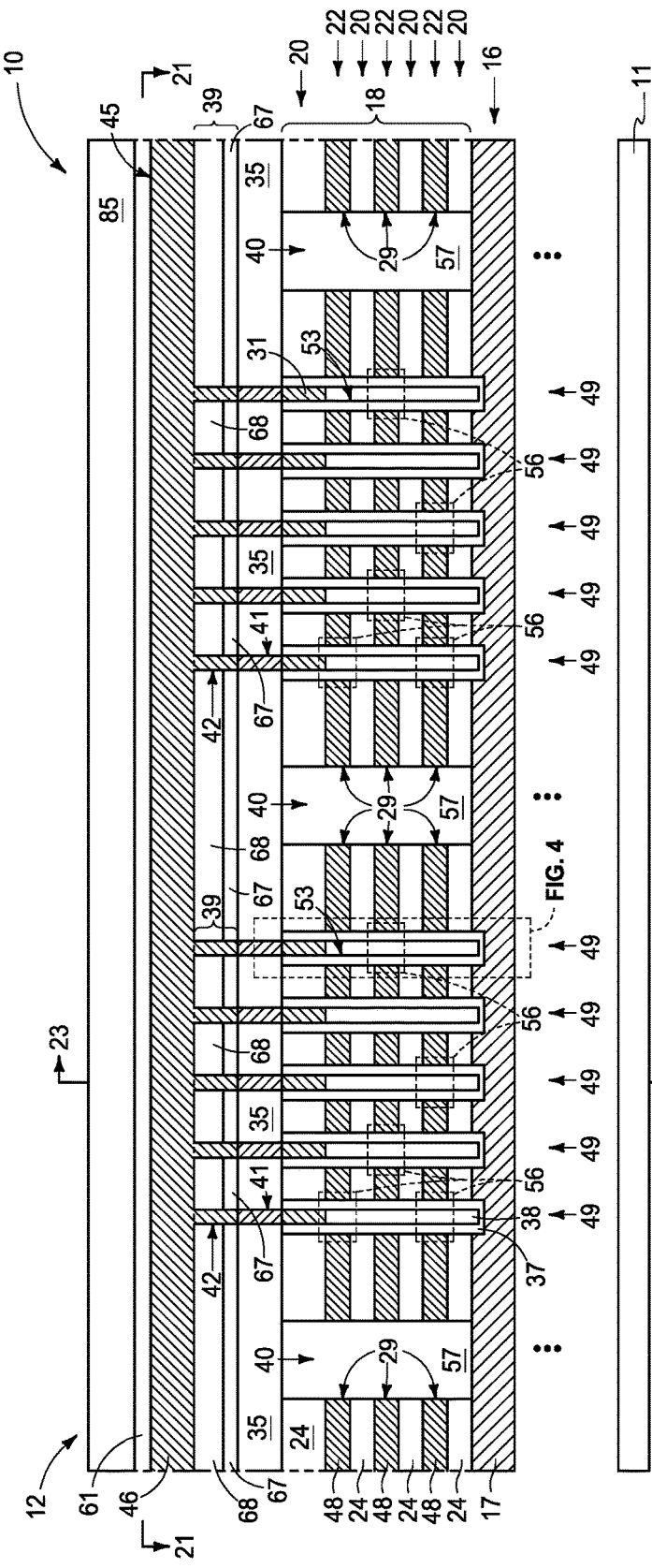

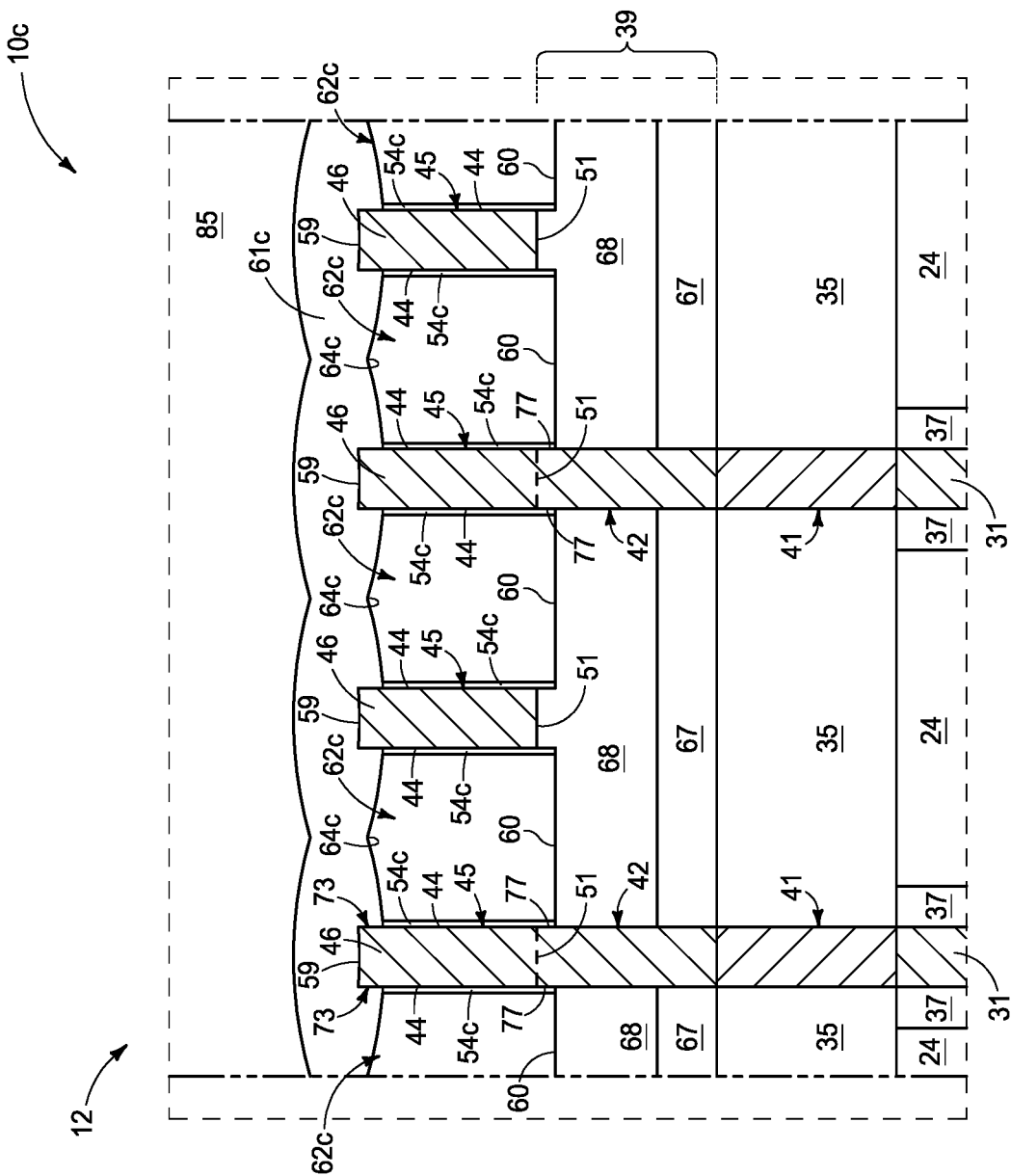

US 11,640,837 B2

MEMORY ARRAYS AND METHODS USED IN FORMING A MEMORY ARRAY

RELATED PATENT DATA

This patent resulted from a continuation application of U.S. patent application Ser. No. 16/793,263, filed Feb. 18, 2020, entitled "Memory Arrays And Methods Used In Forming A Memory Array", naming Armin Saeedi Vandat, Richard J. Hill, and Aaron Michael Lowe as inventors, the disclosure of which is incorporated by reference.

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a diagrammatic cross-sectional view taken through line 2-2 in FIG. 1.

FIGS. 6-24 are diagrammatic sequential sectional, expanded, enlarged, and/or partial views of the construction of FIGS. 1-5, or portions thereof, in process in accordance with some embodiments of the invention.

FIGS. 25-28 show alternate example method and/or structural embodiments of the invention.

DETAILED DESCRIPTION OF EXAMPLE EMBODIMENTS

Figure 4:
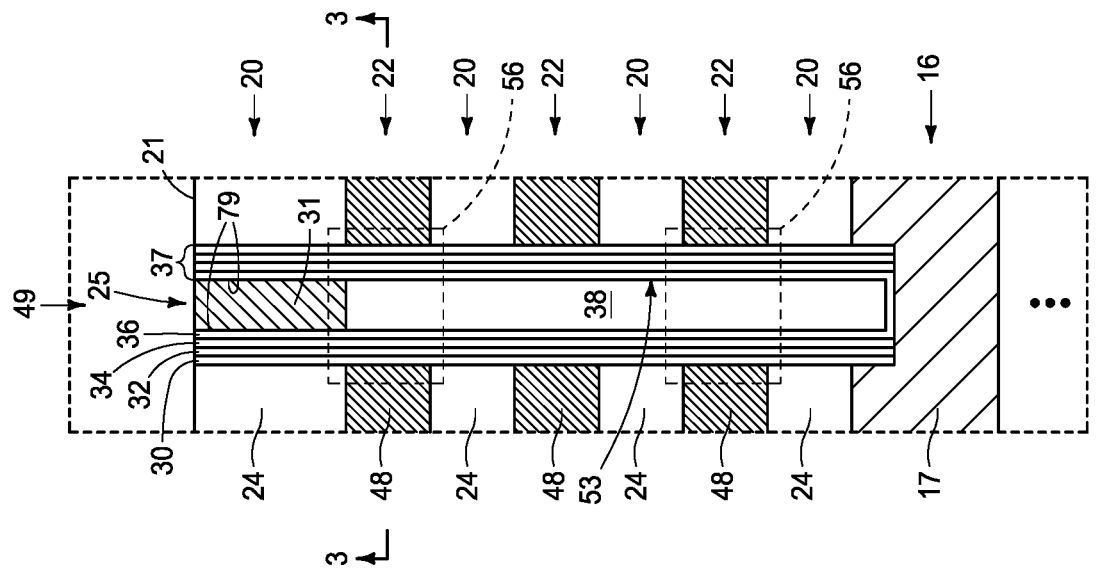
FIGS. 3-5 are enlarged views of portions of FIGS. 1 and 2.
Figure 3:
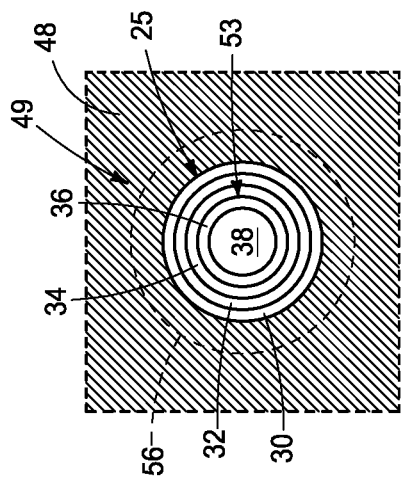
Figure 5:
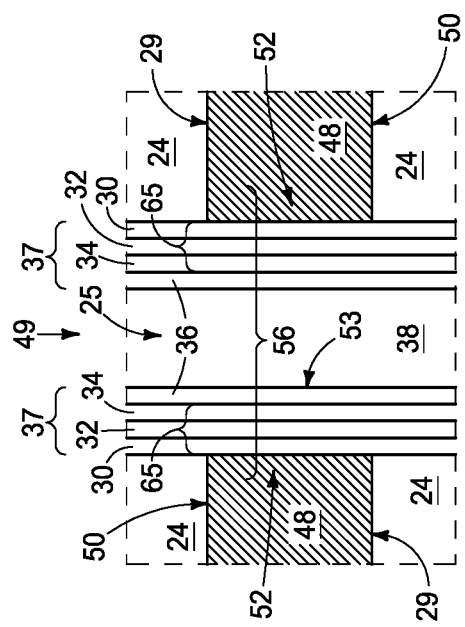

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-24.

Method embodiments of the invention include the forming of digitlines above and that are electrically coupled, in one embodiment directly electrically coupled, to memory cells that are there-below. The memory cells may be of any existing or future-developed memory cell construction, for example those that are non-volatile, are volatile, comprise part of random-access memory, have reversibly-programmable regions, are cross-point memory cells, etc. FIGS. 1-5 show but one example construction 10 having an array or array area 12 in which elevationally-extending strings 49 of transistors and/or memory cells 56 have been formed. Such includes a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-5-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 22 to 60 nanometers. The example uppermost tier 20 may be thicker/thickest compared to one or more other tiers 20 and/or 22. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22 (not shown). Alternately or additionally, at least one of the depicted uppermost and lowest conductive tiers 22 may be a select gate tier. Example insulative tiers 20 comprise insulative material 24 (e.g., silicon dioxide and/or other material that may be of one or more composition(s)).

Channel openings 25 have been formed (e.g., by etching) through insulative tiers 20 and conductive tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory blocks 58. In this document, "block" is generic to include "sub-block". Memory blocks 58 may be considered as being longitudinally elongated and oriented, for example along a direction 55. Any alternate existing or future-developed arrangement and construction may be used.

Example memory blocks 58 are shown as at least in part having been defined by horizontally-elongated trenches 40 that were formed (e.g., by anisotropic etching) into stack 18. Trenches 40 may have respective bottoms that are directly against conductor material 17 (e.g., atop or within) of conductor tier 16 (as shown) or may have respective bottoms that are above conductor material 17 of conductor tier 16 (not shown). Intervening material 57 is in trenches 40 in stack 18 and may provide lateral electrical isolation (insulation) between immediately-laterally-adjacent memory blocks 58. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (TAV's) and not shown.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 1-5 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18.

Channel material 36 has also been formed in channel openings 25 elevationally along insulative tiers 20 and conductive tiers 22 and comprise individual operative channel-material strings 53 in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Regardless, and in one embodiment, conducting material 31 (e.g., a conductive plug/via comprising conductively-doped polysilicon) is directly against laterally-inner sides 79 in an upper portion of individual channel-material strings 53. One or more of materials 30, 32, 34, and 36 may not extend to the top of conducting material 31 (not shown). Further, and regardless, conducting material 31 may not extend to the top of stack 18 (not shown), may extend above stack 18 (not shown), and/or may extend below the bottom of uppermost tier 20 (not shown).

Example conductive tiers 22 comprise conducting material 48 that is part of individual conductive lines 29 (e.g., wordlines) that are also part of elevationally-extending strings 49 of individual transistors and/or memory cells 56. A thin insulative liner (e.g., Al$_2$O$_3$ and not shown) may be formed before forming conducting material 48. Approximate locations of transistors and/or memory cells 56 are indicated with a bracket in FIG. 5 and some with dashed outlines in FIGS. 1-4, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 5) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 6:
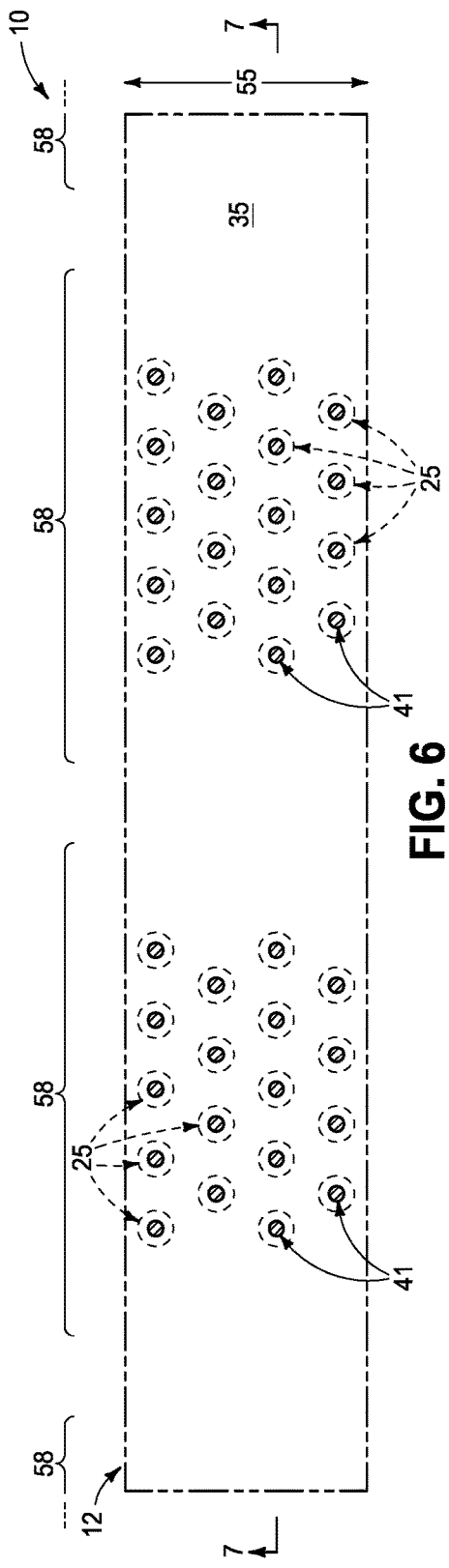
Figure 7:
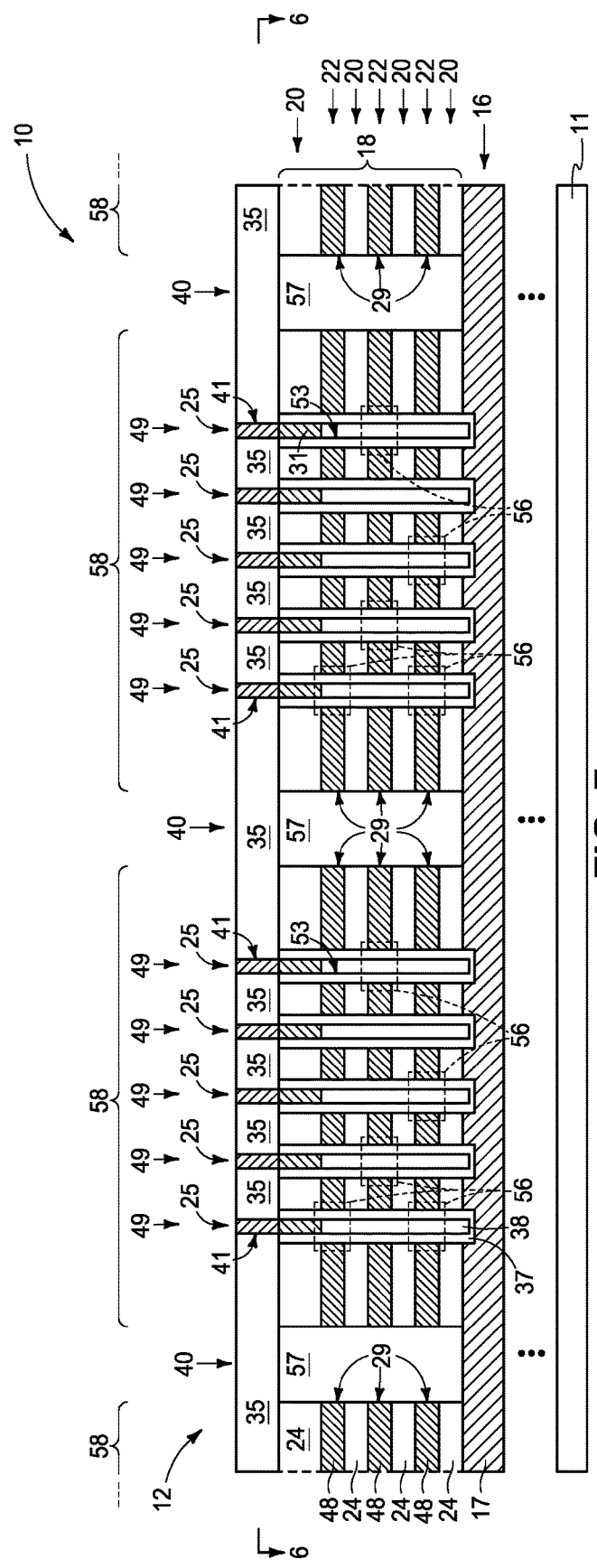

Referring to FIGS. 6 and 7, and in one embodiment, insulative material 35 (e.g., silicon dioxide and/or silicon nitride) has been formed. Conductive vias 41 (e.g., first conductive vias 41) have been formed there-through above and that individually directly electrically couple to individual channel-material strings 53, for example through conducting material 31.

Figure 8:
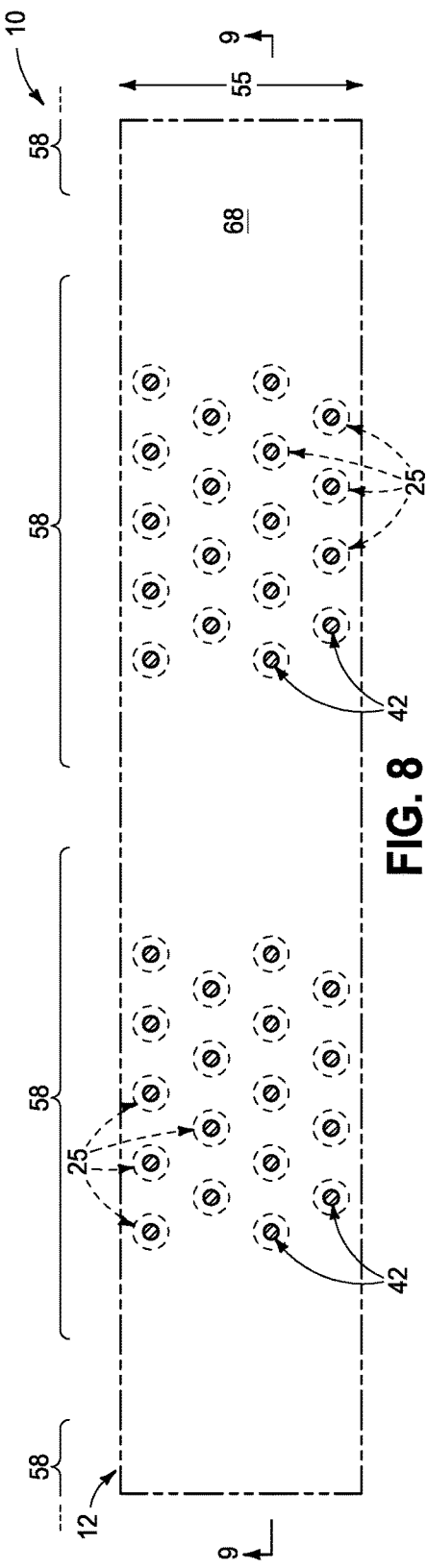
Figure 9:
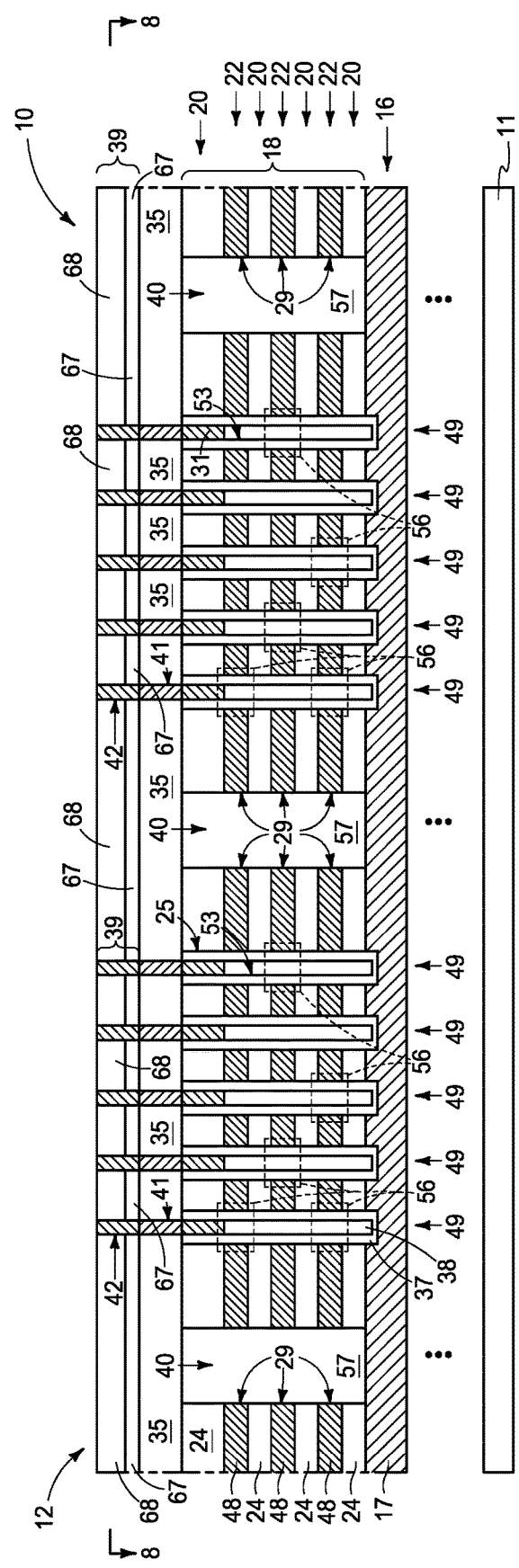
Figure 10:
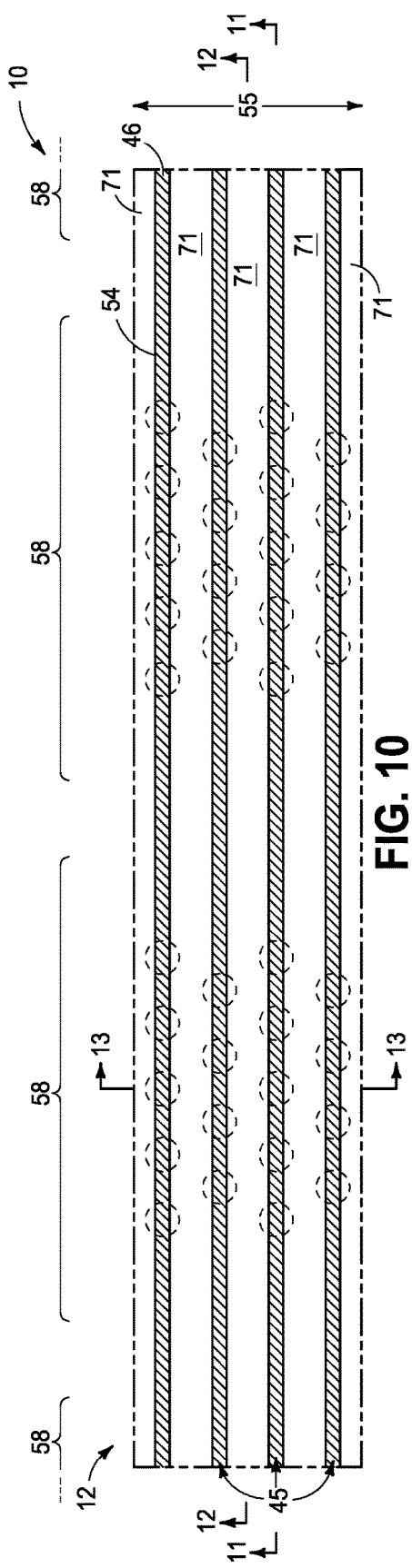
Figure 11:
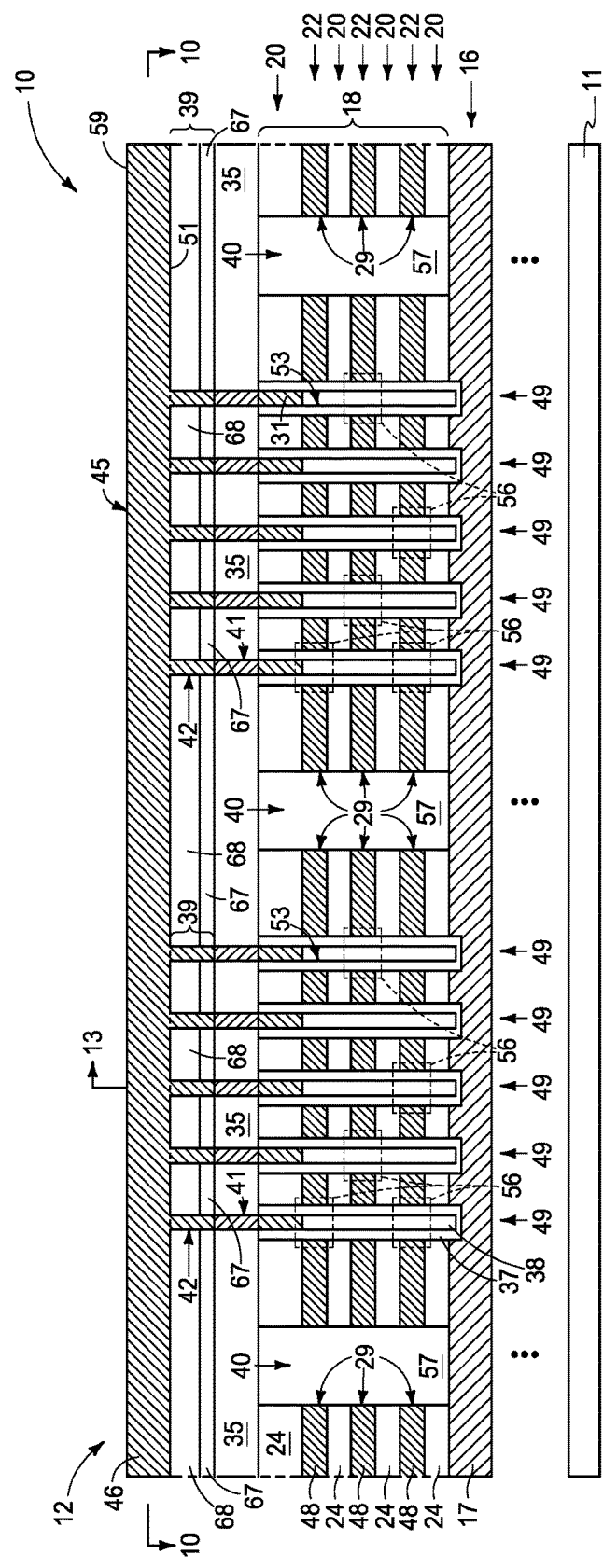
Figure 12:
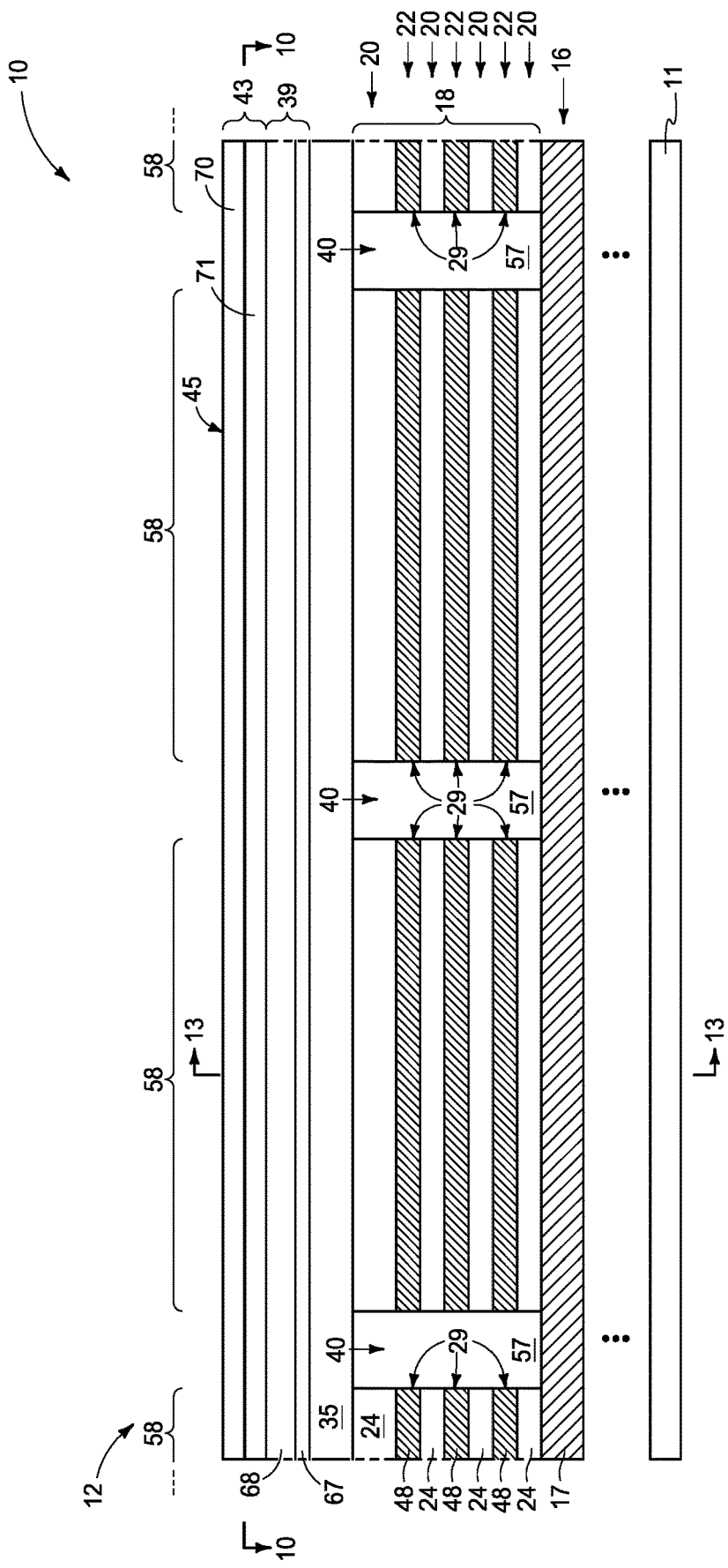
Figure 14:
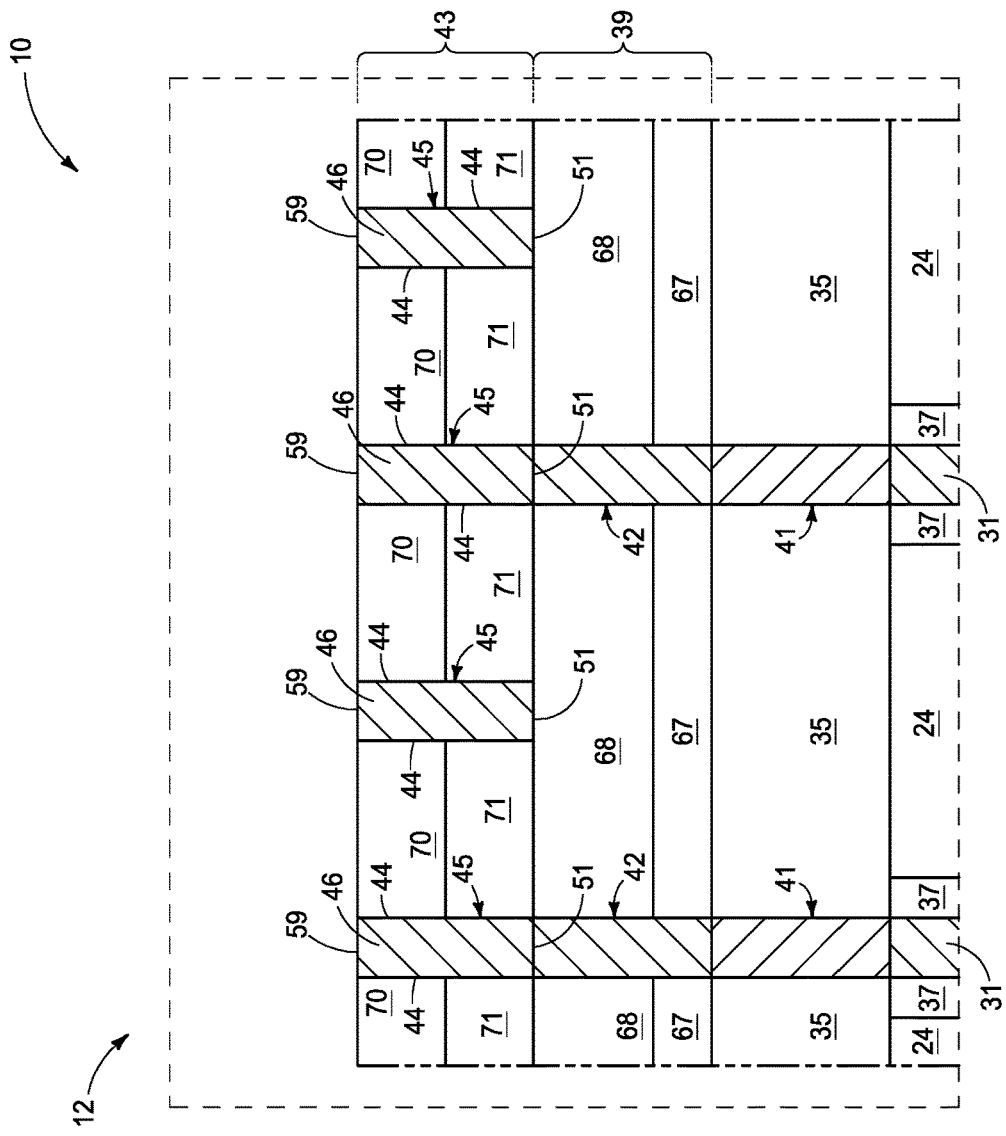
Figure 13:
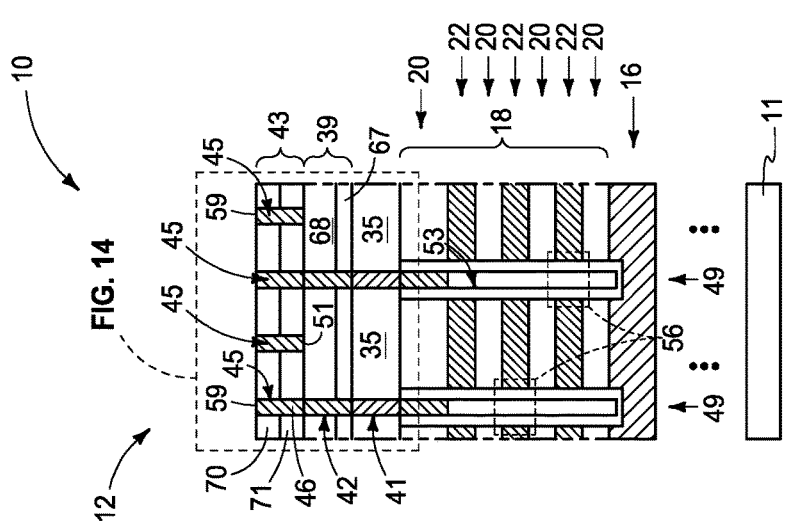

Referring to FIGS. 8 and 9, insulative material 39 (e.g., silicon dioxide 67 and silicon nitride 68) has been formed above insulative material 35 and conductive vias 42 (e.g., second conductive vias 42) have been formed there-through directly above and that individually directly electrically couple to individual first conductive vias 41. Materials/vias 31, 41, and 42 may be of different compositions or of the same composition relative any two of one another. For simplicity and clarity in the figures, materials/vias 31, 41, and 42 are shown as being of the same size and shape in horizontal and vertical cross-sections and perfectly aligned relative one another, but of course need not be so. Further, and regardless, the respective sizes and shapes need not be constant (although constant is shown) in different horizontal and/or vertical cross-sections through the centers of materials/vias 31, 41, and 42.

Referring to FIGS. 10-14, digitlines 45 comprising conductive material 46 have been formed directly above and directly electrically coupled to second conductive vias 42. Digitlines 45 are laterally-spaced relative one another in a vertical cross-section, for example, the cross-section that is exemplified by FIGS. 13 and 14. Insulating material 43 (e.g., silicon nitride 70 over silicon dioxide 71) is laterally-between immediately-adjacent digitlines 45 in the vertical cross-section. Conductive material of the vias and digitlines may be of different compositions or of the same composition relative any two of one another. Further, and by way of example only, formation of the digitlines 45 and second conductive vias 42 may essentially occur during the same conductive-material deposition step, for example in a dual-damascene-like process. For purposes of the continuing discussion, digitlines 45 may be considered as comprising bottoms 51, tops 59, and sidewalls 44.

Figure 16:
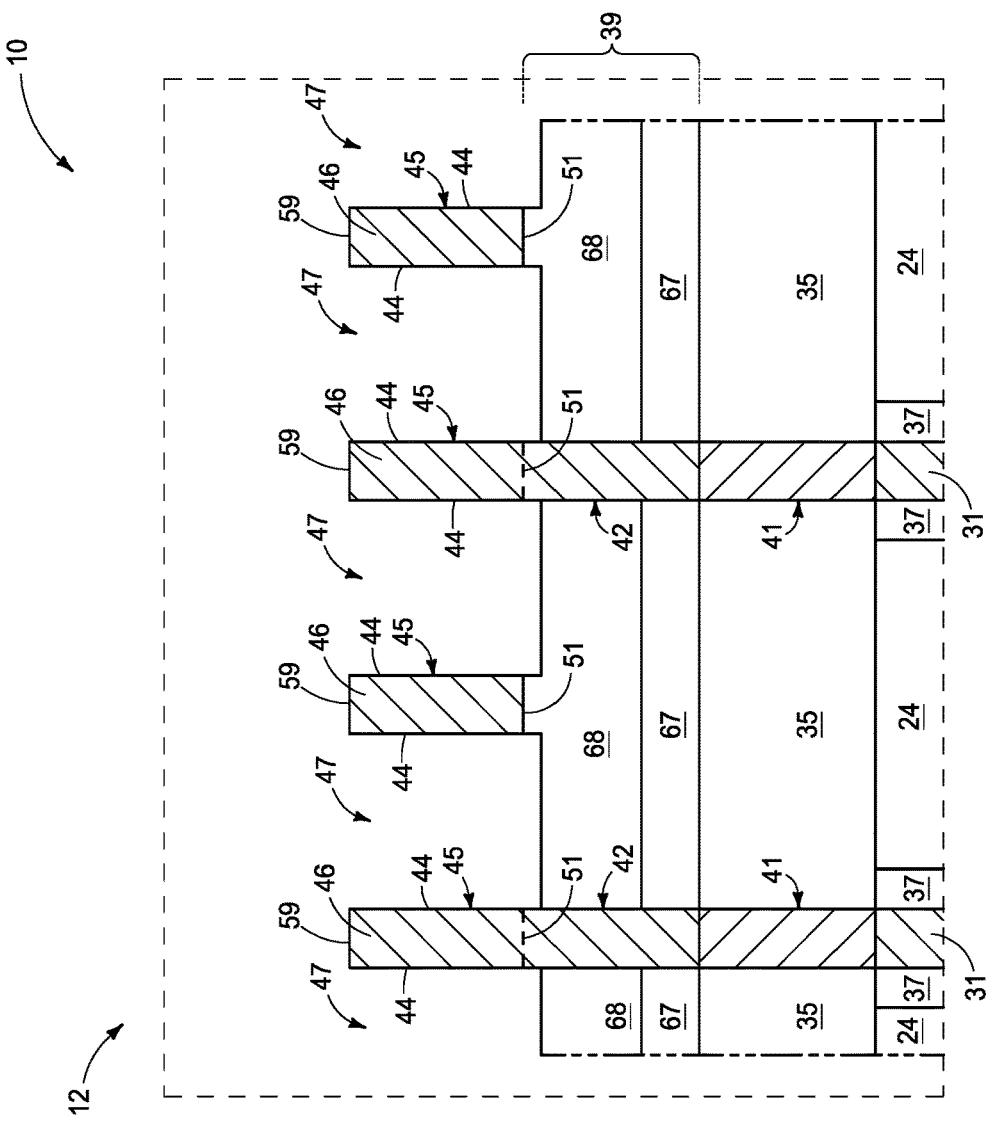
Figure 15:
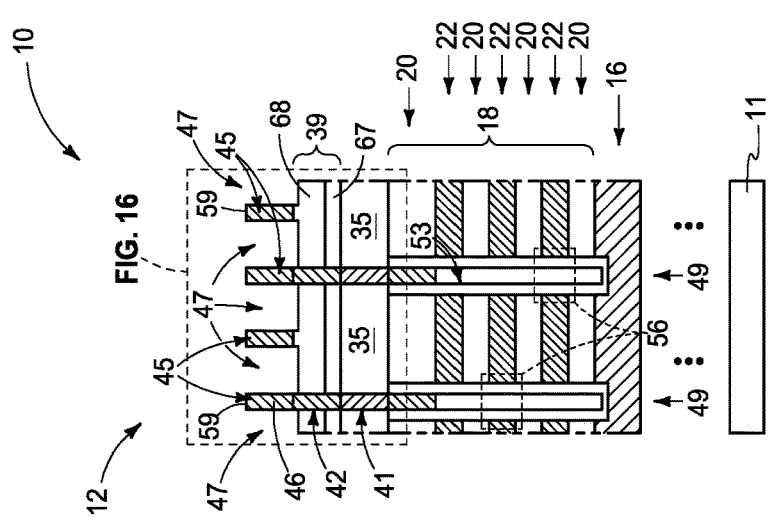

Referring to FIGS. 15 and 16, at least some (all being shown) of insulating material 43 (not shown) has been vertically removed (e.g., by timed anisotropic or isotropic etching selectively relative to conductive material 46) to expose sidewalls 44 of conductive digitline material 46 and form an upwardly-open void-space 47 between immediately-adjacent digitlines 45 in the vertical cross-section. In one embodiment and as shown, some of insulative material 39 has been removed such that bottoms of void-spaces 47 are below digitline bottoms 51.

Figure 18:
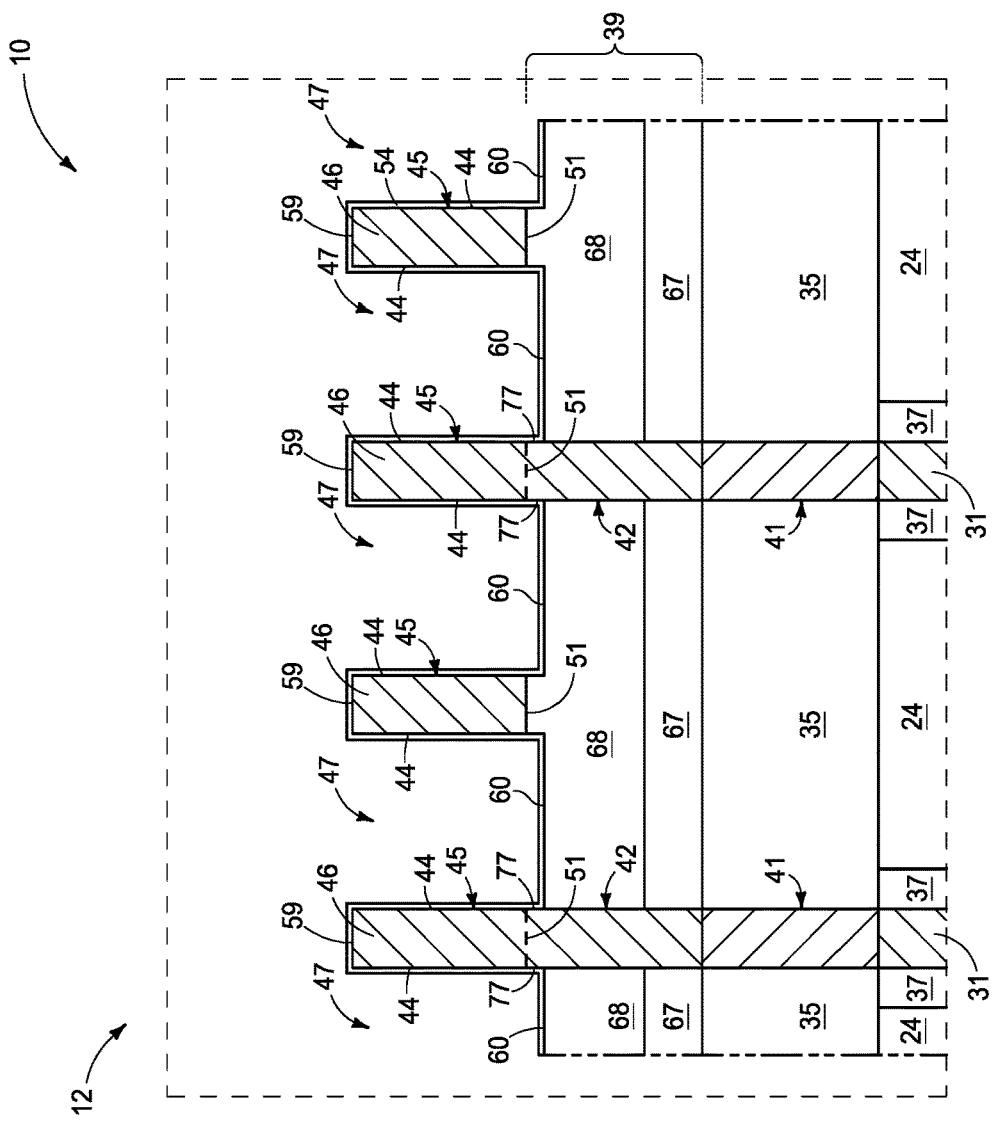
Figure 17:
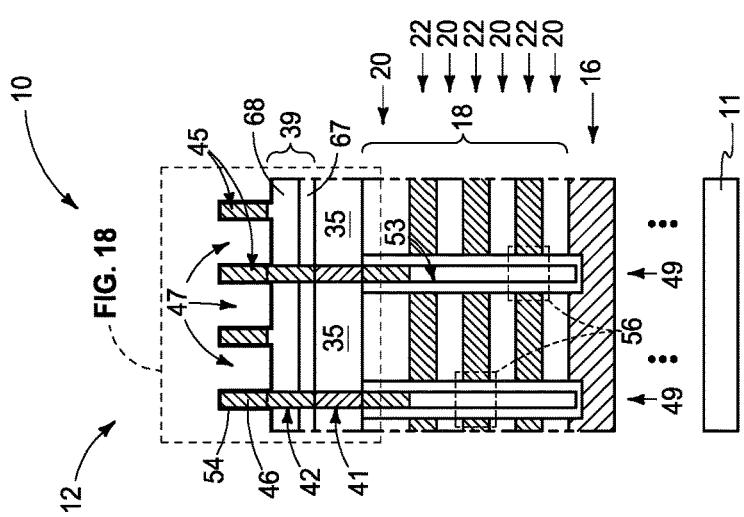

Referring to FIGS. 17 and 18, masking material 54 has been formed over tops 59 and sidewalls 44 of conductive digitline material 46 to less-than-fill upwardly-open void-spaces 47. Accordingly, and in one embodiment, conductive digitline material 46 is covered by or with masking material 54 that is in upwardly-open void-spaces 47. Void-spaces 47 may be considered as comprising respective bases 60 between immediately-adjacent digitlines 45 in the vertical cross-section, and that in one embodiment are also covered with masking material 54 as shown. Some or all of masking material 54 may remain in a finished circuit construction. Alternately, such may ultimately be all removed. Regardless, in one embodiment the masking material is insulative, in another embodiment is semiconductive (e.g., less-than-conductively-doped semiconductor material, such as lightly-doped polysilicon), and in another embodiment is conductive (e.g., metal material and/or conductively-doped semiconductor material, such as heavily-doped polysilicon). Any suitable materials may be used. Ideally, masking material 54 is insulative and remains over sidewalls 44 of conductive digitline material 46 in a finished circuit construction, with silicon nitride, silicon dioxide, and/or aluminum oxide being some examples. Insulative material is more desired than semiconductive and/or conductive materials towards maximizing lateral-spacing between immediately-adjacent digitlines 45 to minimize parasitic capacitance there-between assuming some or all of masking material 54 remains in void-spaces 47 in a finished circuit construction.

Figure 20:
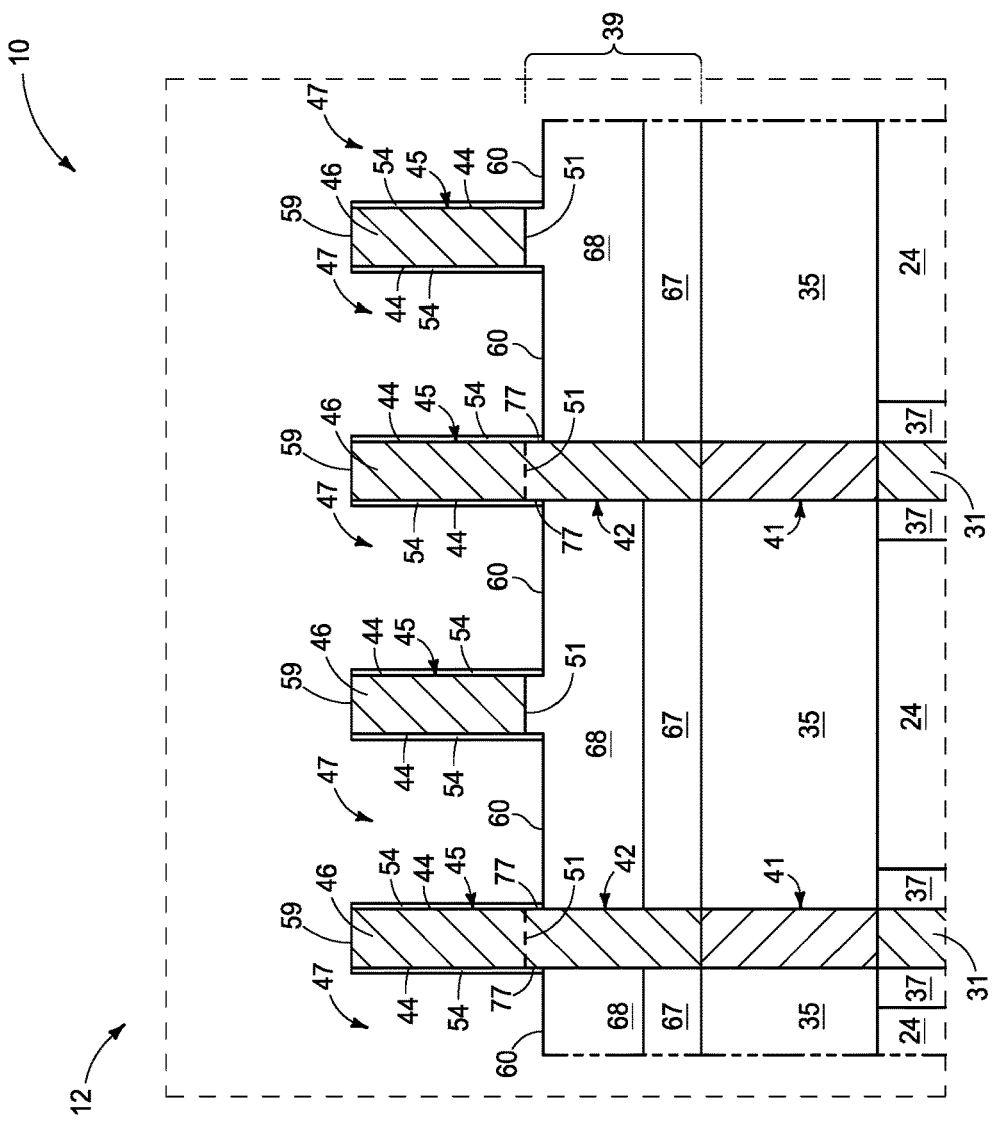
Figure 19:
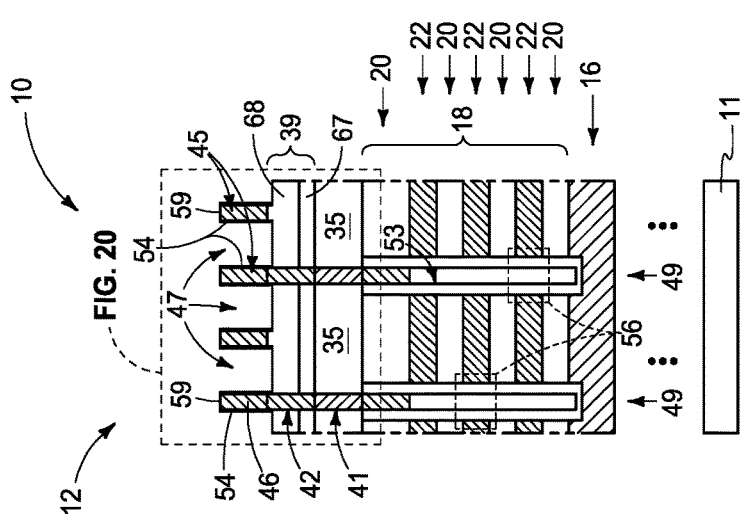
Figure 24:
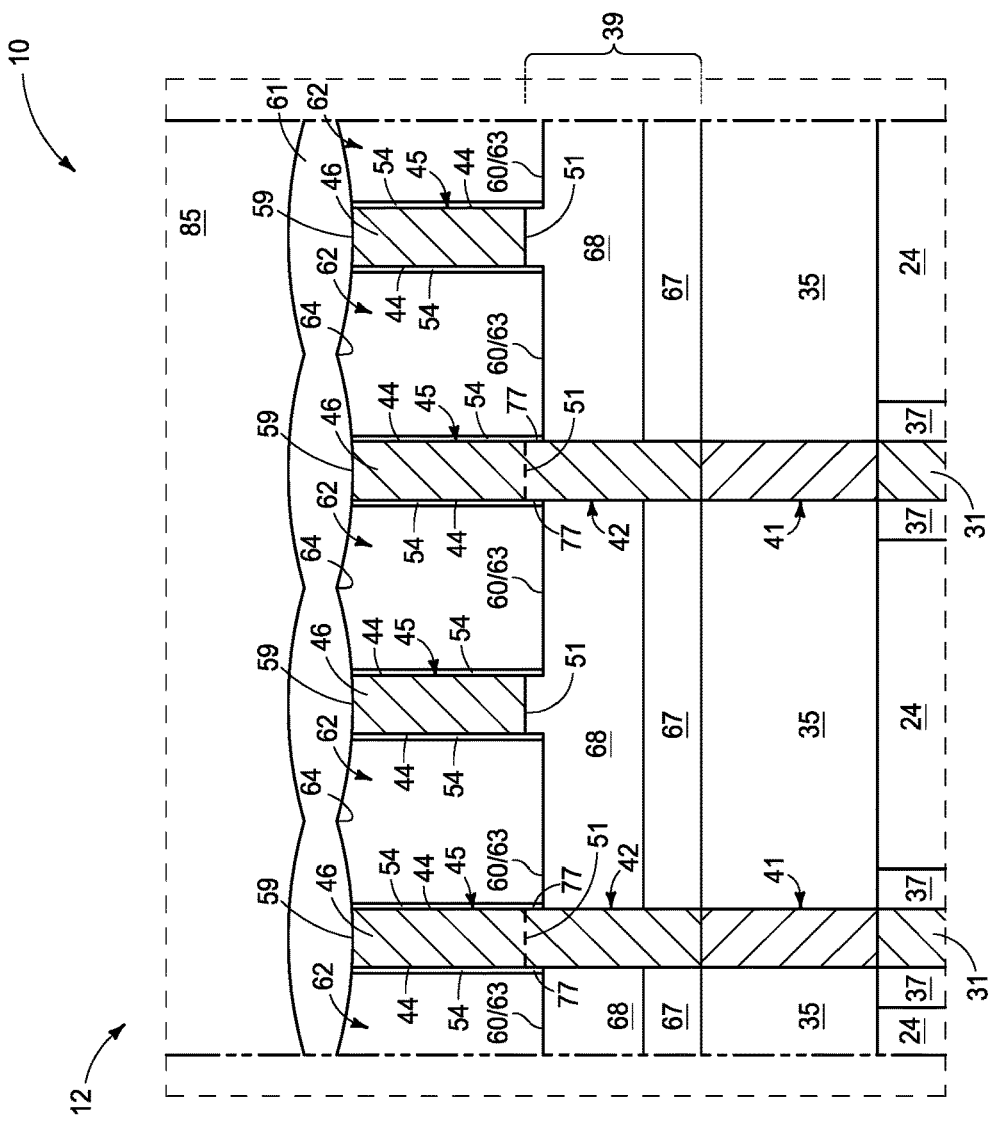
Figure 23:
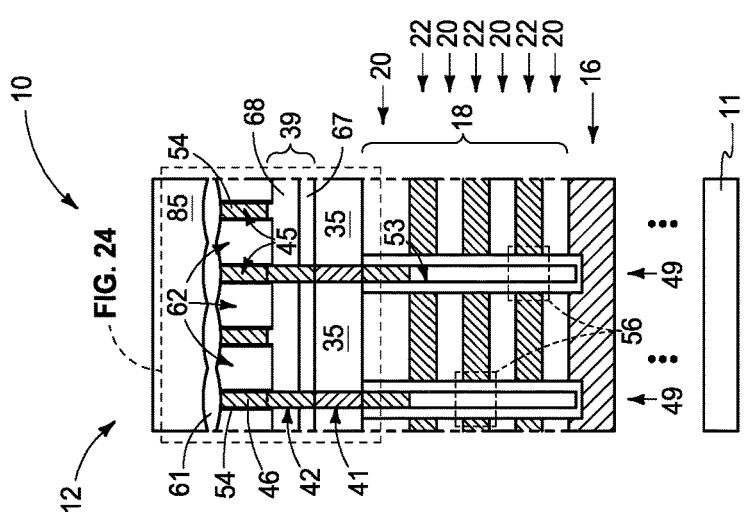

Referring to FIGS. 19 and 20, masking material 54 has been removed from being directly above tops 59 of conductive digitline material 46 (e.g., by dry anisotropic etching and that may be conducted in the absence of any masking material atop construction 10 at least in array area 12) to expose tops 59 and leave masking material 54 over sidewalls 44 of conductive digitline material 46 in upwardly-open void-spaces 47. In one embodiment and as shown, masking material 54 extends below bottoms 51 of digitlines 45 along sidewalls 77 of conductive vias 42. In one embodiment and as shown, where bases 60 are covered with masking material 54 as in FIGS. 17 and 18, such act of removing may also remove masking material 54 from being centrally over bases 60. In one embodiment and as shown, such act of removing exposes all of tops 59 and leaves all of sidewalls 44 of conductive digitline material 46 covered.

Referring to FIGS. 21-24, insulative material 61 has been selectively grown from exposed conductive digitline material 46 relative to masking material 54 across upwardly-open void-spaces 47 (not so designated in FIGS. 23 and 24) to form covered void-spaces 62 there-from between immediately-adjacent digitlines 45 in the vertical cross-section. Any existing or future-developed method(s) may be used that enables growth of insulative material 61 from conductive digitline material 46 selectively relative to masking material 54. The artisan is capable of selecting such selective deposition techniques, and exposed portions of masking material 54 and/or conductive digitline material 46 material may need to be treated prior to such act of selectively growing to enable such selectively growing.

As an example, silicon dioxide can be deposited selectively relative to tungsten. Specifically, silicon dioxide surfaces can first be inhibited from silicon dioxide growth by exposure to (N,N-dimethyamino)-trimethylsilane (DMATMS) or bis(N,N-dimethylamino)-dimethylsilane (DMADMS), hexamethyl-disilazane (HMDS), 1H,1H,2H,2H-perfluorooctyltrichlorosilane (FOTS or PFOCTS), or heptadecafluoro-1,1,2,2-tetrahydrodecyl) triethoxysilane (HDFTEOS) that only bonds to hydroxy groups to effectively functionalize the silicon dioxide surfaces from being deposited upon by silicon dioxide. Thereafter, silicon dioxide (containing trace carbon) can be grown by atomic layer deposition from other surfaces that have not been so-functionalized (even if exposed to any of the DMATMS, DMADMS, HMDS, FOTS, or HDFTEOS), for example using tetraethyl orthosilicate (TEOS) at a pedestal temperature of 300° C. to 500° C., pressure of 100 Torr to 500 Torr, TEOS flow rate of 1,000 sccm to 20,000 sccm, and $O_3$ flow at 100 sccm to 17,000 sccm.

As another example, spin-on dielectric (SOD) composed of perhydro-polysilazane will also selectively deposit on tungsten relative to silicon dioxide that has been first inhibited as described above. SOD may be selectively deposited onto tungsten room temperature followed by baking at 150° C. If baked in an ambient of $N_2$, oxynitride will be formed. Regardless, after baking, it can be densified in steam at 500° C. to 1,000° C.

Further, $SiO_xN_y$ can be deposited on a metal surface selectively relative to silicon dioxide first inhibited as described above using $SiH_4$ with one or more of $N_2O$, $CO_2$ and $NH_3$, for example at 375° C., pressure of 1 Torr to 10 Torr, RF power of 100 W to 200 W and gas flows of 90 sccm to 900 sccm.

Additionally, $Si_3N_4$ can be deposited on a metal surface selectively relative to silicon dioxide first inhibited as described above using $SiH_4$ and $NH_3$, for example at 400° C., pressure of 1 Torr to 10 Torr, RF power of 300 W to 400 W, $SiH_4$ flow of 500 sccm to 700 sccm, and $NH_3$ flow from 3,000 sccm to 5,000 sccm.

In one embodiment and as shown, the selectively growing of material 61 has only been from tops 59 of conductive digitline material 46 as all of sidewalls 44 are covered by masking material 54. In one embodiment and as shown, covered void-spaces 62 have been formed to have respective bottoms 63 that are below bottoms 51 of digitlines 45. In one embodiment and as shown, covered void-spaces 62 have been formed to have respective tops 64 (FIG. 24) that are above (i.e., higher than) tops 59 of digitlines 45. Regardless, example construction 10 is shown as comprising dielectric material 85 (e.g., silicon dioxide and/or silicon nitride) that has subsequently been formed atop insulative material 61.

Any other attribute(s) or aspect(s) as shown and/or described herein with respect to other embodiments may be used in the embodiments shown and described with reference to FIGS. 1-24.

Figure 25:
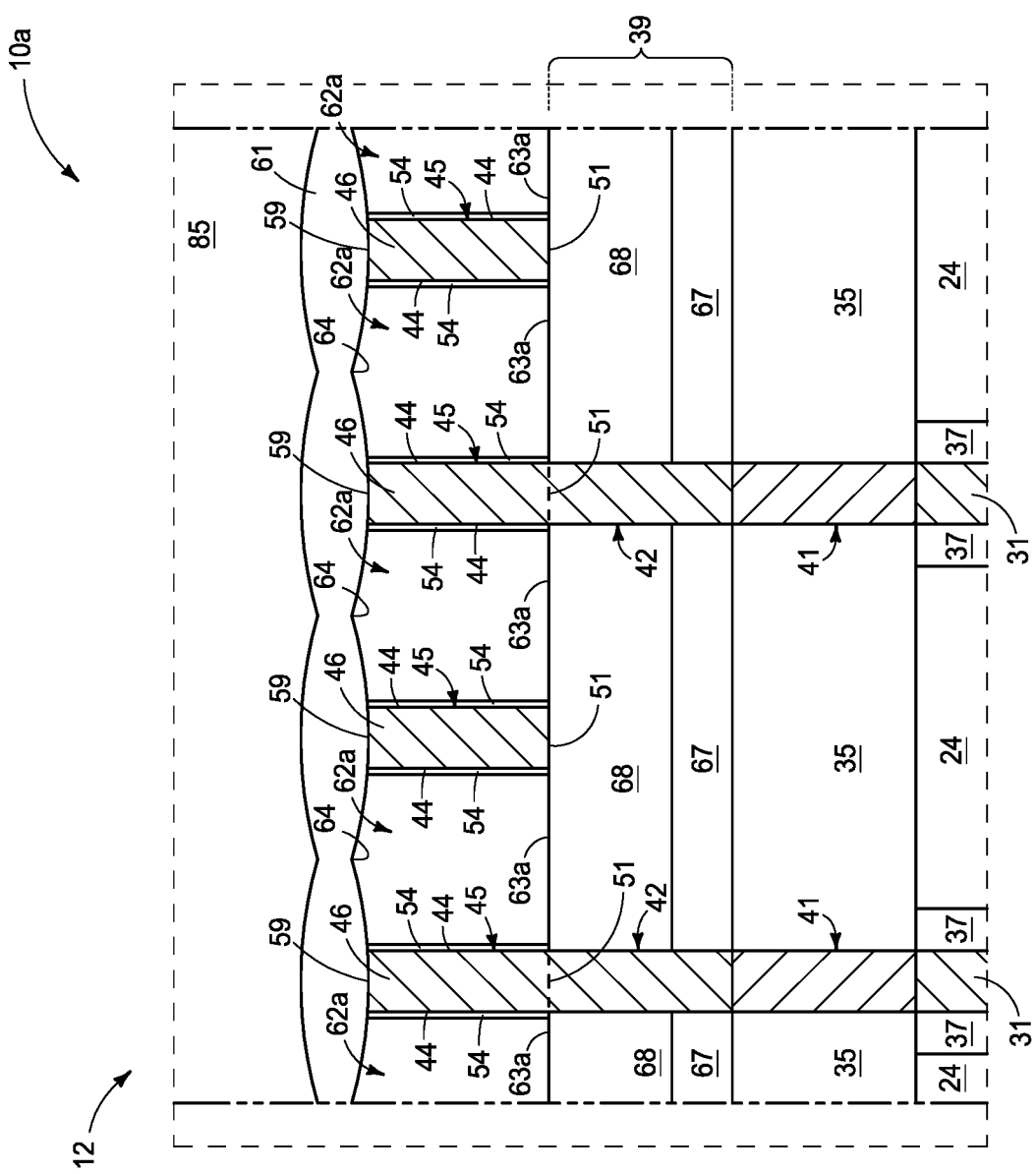

Alternate constructions may of course result. For example, and by way of example only, FIG. 25 shows an alternate example embodiment construction 10a wherein covered void-spaces 62a have respective bottom 63a that are elevationally-coincident with bottoms 51 of digitlines 45. Like numerals from the above-described embodiments have been used where appropriate, with some construction differences being indicated with the suffix "a". Any other attribute(s) or aspect(s) as shown and/or described herein with respect to other embodiments may be used.

Figure 26:
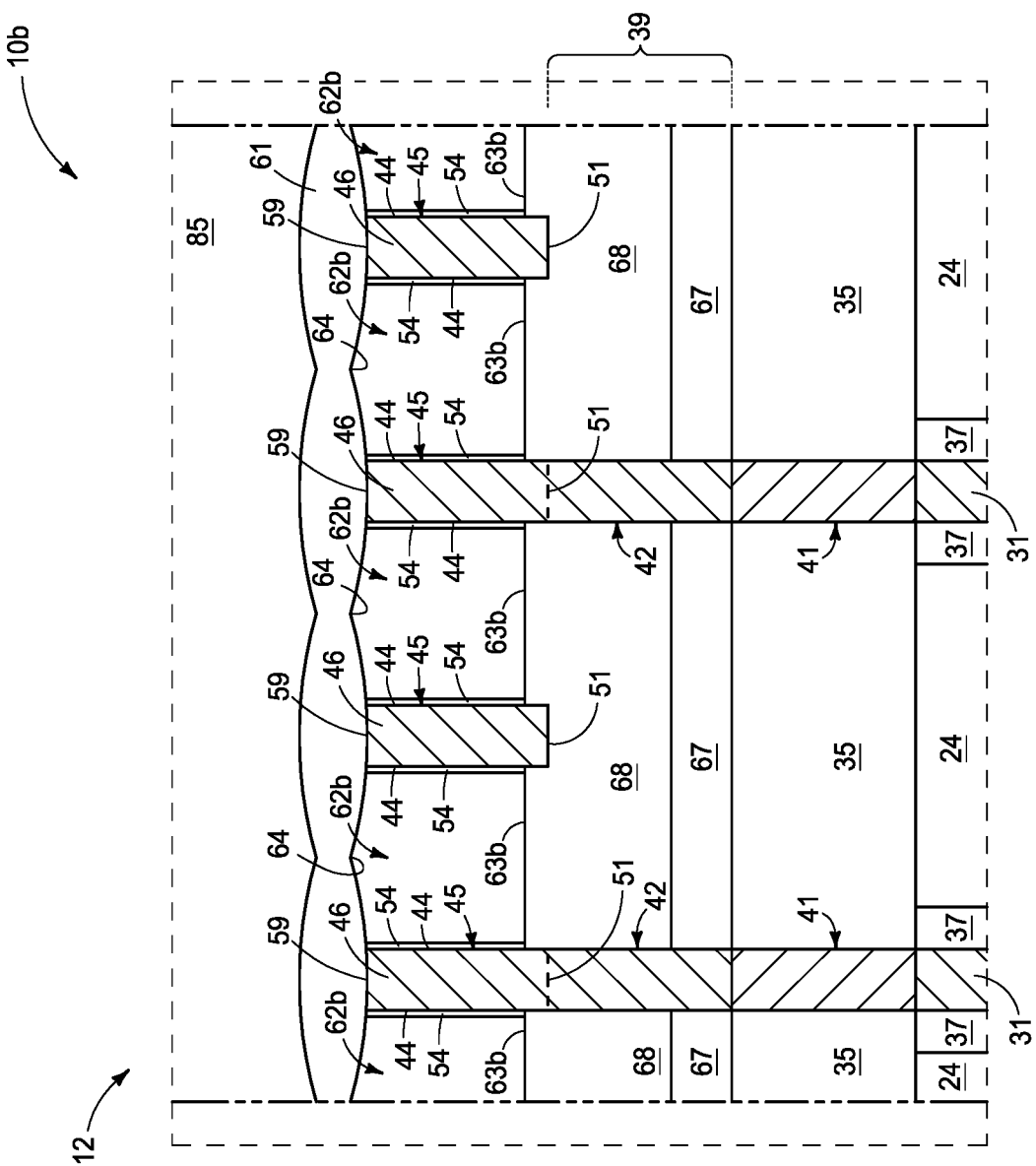

FIG. 26 shows another alternate embodiment construction 10b wherein covered void-spaces 62b have respective bottom 63b that are above bottoms 51 of digitlines 45. Like numerals from the above, described embodiments have been used where appropriate, with some construction differences being indicated with the suffix "b". Any other attribute(s) or aspect(s) as shown and/or described herein with respect to other embodiments may be used.

An alternate example method is now described with reference to FIGS. 27 and 28. Like numerals from the above-described embodiments have been used where appropriate, with some construction differences being indicated with the suffix "c" or with different numerals.

Figure 27:
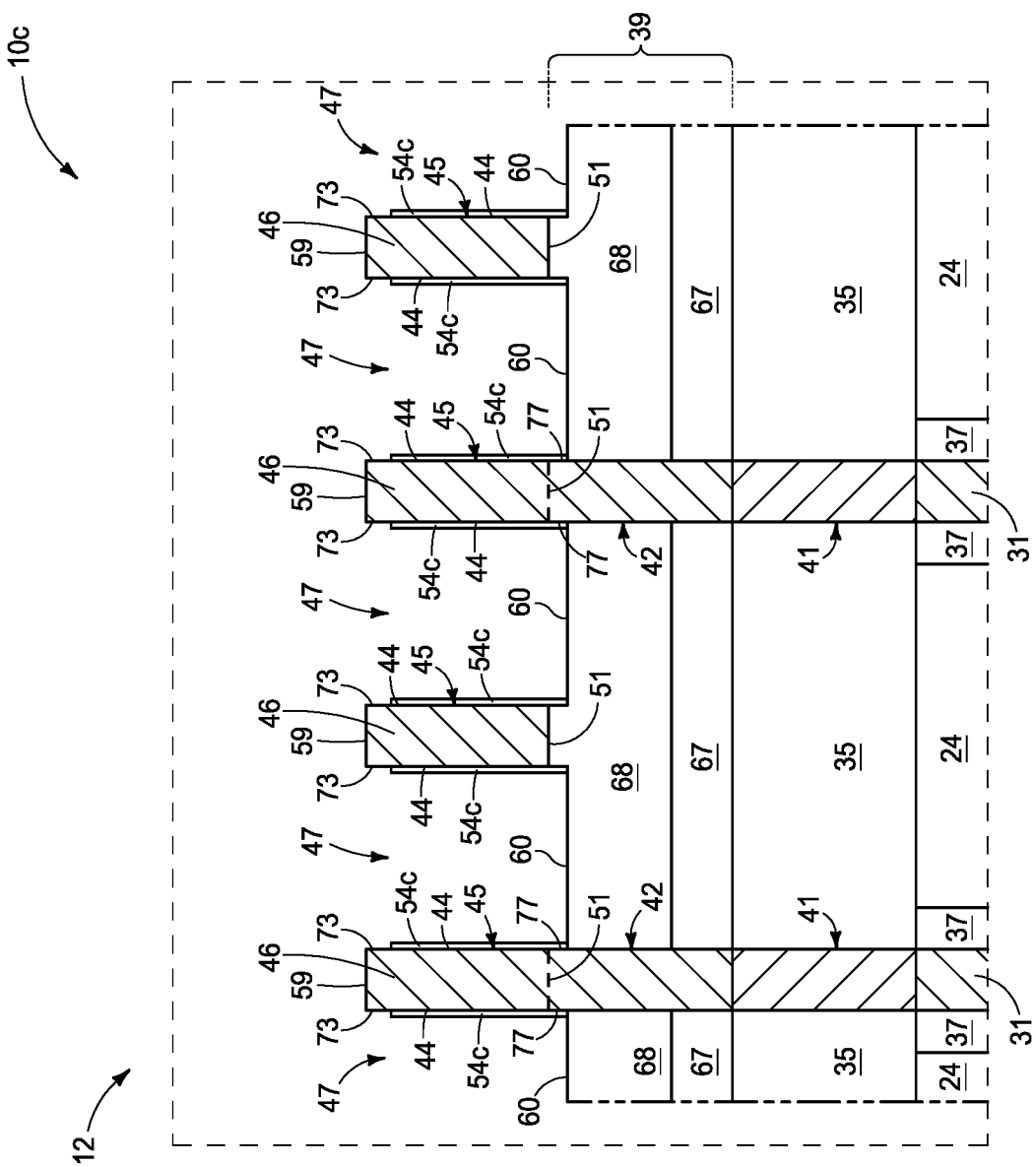

Referring to FIG. 27, such shows alternate processing to that of FIG. 20. Masking material 54 has been removed from uppermost portions 73 of sidewalls 44 of conductive digitline material 46, leaving a majority of sidewalls 44 of conductive digitline material 46 covered by masking material 54 in the vertical cross-section. In one embodiment, uppermost portions 73 of sidewalls 44 are no more than 15% of height of the digitlines from their respective tops to their respective bottoms.

Referring to FIG. 28, insulative material 61c has been selectively grown from tops 59 and uppermost sidewall portions 73 of conductive digitline material 46 relative to masking material 54 across the upwardly-open void-spaces to form covered void-spaces 62c there-from between immediately-adjacent digitlines 45 in the vertical cross-section. Such may result in void-space tops 64c being below digitline tops 59 as shown.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

Embodiments of the invention include a memory array (e.g., 12) comprising digitlines (e.g., 45) above and electrically coupled to memory cells (e.g., 56) there-below. The digitlines are laterally-spaced relative one another in a vertical cross-section (e.g., that of any of FIGS. 26-28). Conductive vias (e.g., 42) are directly below and directly electrically coupled to individual of the digitlines. Void-space (e.g., 62b, 62c) is laterally-between immediately-adjacent of the digitlines in the vertical cross-section. The void-spaces individually comprise at least one of (a) and (b), where (a): tops (e.g., 64c) of the void-spaces (e.g., 62c) are below tops (e.g., 59) of the digitlines, and (b): bottoms (e.g., 63b) of the void-spaces (e.g., 62b) are above bottoms (e.g., 51) of the digitlines. Any other attribute(s) or aspect(s) as shown and/or described herein with respect to other embodiments may be used.

Embodiments of the invention include a memory array (e.g., 12) comprising digitlines (e.g., 45) above and electrically coupled to memory cells (e.g., 56) there-below. The digitlines are laterally-spaced relative one another in a vertical cross-section (e.g., that of FIG. 24) and comprise conductive material (e.g., 46). Conductive vias (e.g., 42) are directly below and directly electrically coupled to individual of the digitlines. Void-space (e.g., 62, 62a, 62b, 62c) is laterally-between immediately-adjacent of the digitlines in the vertical cross-section. The memory array comprises at least one of (a) and (b), where (a): conducting material (e.g., 54) of different composition from that of the conductive digitline material being over and longitudinally-along sidewalls (e.g., 44) of the digitlines, and (b): semiconductive material (e.g., 54) being over and longitudinally-along sidewalls of the digitlines. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprises forming digitlines above and electrically couple to memory cells there-below. The digitlines are laterally-spaced relative one another in a vertical cross-section. An upwardly-open void-space is laterally-between immediately-adjacent of the digitlines in the vertical cross-section. Conductive material of the digitlines is covered with masking material that is in and less-than-fills the upwardly-open void-spaces. The masking material is removed from being directly above tops of the digitlines to expose the conductive digitline material and to leave the masking material over sidewalls of the conductive digitline material in the upwardly-open void-spaces. Insulative material is selectively grown from the exposed conductive digitline material relative to the masking material across the upwardly-open void-spaces to form covered void-spaces there-from between the immediately-adjacent digitlines in the vertical cross-section.

In some embodiments, a method used in forming a memory array comprises forming a stack comprising vertically-alternating insulative tiers and conductive tiers. Channel-material strings of memory-cell strings extend through the insulative and conductive tiers. First conductive vias are formed above and individually directly electrically couple to individual of the channel-material strings. Digitlines are formed directly above and directly electrically couple to second conductive vias that are directly above and individually directly electrically couple to the first conductive vias. The digitlines are laterally-spaced relative one another in a vertical cross-section. Insulating material is laterally-between immediately-adjacent of the digitlines in the vertical cross-section. At least some of the insulating material is vertically removed to expose sidewalls of conductive material of the digitlines and form an upwardly-open void-space between the immediately-adjacent digitlines in the vertical cross-section. Masking material is formed over tops and the sidewalls of the digitlines to less-than-fill the upwardly-open void-spaces. The masking material is removed from being directly above the tops of the digitlines to expose such tops and leave the masking material over the sidewalls of the digitlines in the upwardly-open void-spaces. Insulative material is selectively grown from material of the exposed digitlines relative to the masking material across the upwardly-open void-spaces to form covered void-spaces there-from between the immediately-adjacent digitlines in the vertical cross-section.

In some embodiments, a memory array comprises digitlines above and electrically coupled to memory cells there-below. The digitlines are laterally-spaced relative one another in a vertical cross-section. Conductive vias are directly below and directly electrically couple to individual of the digitlines. Void-space is laterally-between immediately-adjacent of the digitlines in the vertical cross-section. The void-spaces individually comprise at least one of (a) and (b), where (a): tops of the void-spaces are below tops of the digitlines, and (b): bottoms of the void-spaces are above bottoms of the digitlines.

In some embodiments, a memory array comprises digitlines above and electrically coupled to memory cells there-below. The digitlines are laterally-spaced relative one another in a vertical cross-section. The digitlines comprise conductive material. Conductive vias are directly below and directly electrically coupled to individual of the digitlines. Void-space is laterally-between immediately-adjacent of the digitlines in the vertical cross-section. The memory array comprises at least one of (a) and (b), where (a): conducting material of different composition from that of the conductive digitline material being over and longitudinally-along sidewalls of the digitlines, and (b): semiconductive material being over and longitudinally-along sidewalls of the digitlines.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising:
digitlines comprising metal material above and electrically coupled to memory cells there-below, the digitlines being laterally-spaced relative one another in a vertical cross-section;
conductive vias directly below and directly electrically coupled to individual of the digitlines; and
void-spaces, individual of the void-spaces being laterally-between immediately-adjacent of the digitlines in the vertical cross-section, the void-spaces individually comprising at least one of (a) and (b), where,
(a): tops of the void-spaces are below tops of the digitlines; and
(b): bottoms of the void-spaces are above bottoms of the digitlines.

2. The memory array of claim 1 comprising (a).
3. The memory array of claim 1 comprising (b).
4. The memory array of claim 1 wherein the memory cells comprise strings of the memory cells, the strings of memory cells comprising strings of channel material.
5. The memory array of claim 4 comprising NAND.
6. The memory array of claim 1 comprising (a) and (b).
7. The memory array of claim 1 comprising (a) and not (b).
8. The memory array of claim 1 comprising (b) and not (a).
9. The memory array of claim 1 comprising (a), the void-spaces having respective bottoms that are elevationally-coincident with bottoms of the digitlines.
10. The memory array of claim 1 comprising (a), the void-spaces having respective bottoms that are below bottoms of the digitlines.
11. A memory array comprising:
digitlines comprising metal material above and electrically coupled to memory cells there-below, the digitlines being laterally-spaced relative one another in a vertical cross-section, the digitlines comprising conductive material;
conductive vias directly below and directly electrically coupled to individual of the digitlines;
void-spaces, individual of the void-spaces being laterally-between immediately-adjacent of the digitlines in the vertical cross-section; and
wherein at least one of (a) and (b), where,
(a): conducting material of different composition from that of the conductive digitline material being over and longitudinally-along sidewalls of the digitlines; and
(b): semiconductive material being over and longitudinally-along sidewalls of the digitlines.
12. The memory array of claim 11 comprising (a).
13. The memory array of claim 11 comprising (b).
14. The memory array of claim 11 comprising (a) and (b).
15. The memory array of claim 11 comprising (a) and not (b).
16. The memory array of claim 11 comprising (b) and not (a).
17. The memory array of claim 11 wherein the void-spaces have respective bottoms that are elevationally-coincident with bottoms of the digitlines.
18. The memory array of claim 17 comprising (a) and (b).
19. The memory array of claim 17 comprising (a) and not (b).
20. The memory array of claim 17 comprising (b) and not (a).
21. The memory array of claim 11 wherein the void-spaces have respective bottoms that are below bottoms of the digitlines.
22. The memory array of claim 21 comprising (a) and (b).
23. The memory array of claim 21 comprising (a) and not (b).
24. The memory array of claim 21 comprising (b) and not (a).
25. The memory array of claim 11 wherein the void-spaces have respective bottoms that are above bottoms of the digitlines.
26. The memory array of claim 25 comprising (a) and (b).
27. The memory array of claim 25 comprising (a) and not (b).
28. The memory array of claim 25 comprising (b) and not (a).
29. A memory array comprising:
digitlines above and electrically coupled to memory cells there-below, the digitlines being laterally-spaced relative one another in a vertical cross-section, the digitlines comprising conductive material;
conductive vias directly below and directly electrically coupled to individual of the digitlines;
void-spaces, individual of the void-spaces being laterally-between immediately-adjacent of the digitlines in the vertical cross-section; and
insulative material over, longitudinally-along, and directly against uppermost portions of the digitlines, the insulative material being directly against the conductive material of the digit lines and being longitudinally-along and directly against the individual void-space that is there-below.

30. The memory array of claim 29 wherein uppermost portions of sidewalls of the digitlines are no more than 15% of height of the digitlines from their respective tops to their respective bottoms.

31. The memory array of claim 29 wherein the void-spaces individually comprise at least one of (a) and (b), where,
   (a): tops of the void-spaces are below tops of the digitlines; and
   (b): bottoms of the void-spaces are above bottoms of the digitlines.

32. The memory array of claim 31 comprising (a).

33. The memory array of claim 31 comprising (b).

34. The memory array of claim 31 comprising (a) and (b).

35. The memory array of claim 31 comprising (a) and not (b).

36. The memory array of claim 31 comprising (b) and not (a).

37. The memory array of claim 29 comprising at least one of (a) and (b), where,
   (a): conducting material of different composition from that of the conductive digitline material being over and longitudinally-along the sidewalls of the digitlines; and
   (b): semiconductive material being over and longitudinally-along the sidewalls of the digitlines.

38. The memory array of claim 37 comprising (a).

39. The memory array of claim 37 comprising (b).

40. The memory array of claim 37 comprising (a) and (b).

41. The memory array of claim 37 comprising (a) and not (b).

42. The memory array of claim 37 comprising (b) and not (a).

* * * * *